United States Patent [19]

Kobatake

[11] Patent Number: 5,773,872
[45] Date of Patent: Jun. 30, 1998

[54] SEMICONDUCTOR DEVICE HAVING AN INTEGRATED DIFFERENTIAL CIRCUIT WITH AN IMPROVED COMMON-MODE REJECTION RATIO (CMRR)

[75] Inventor: Hiroyuki Kobatake, Tokyo, Japan

[73] Assignee: NEC Corporation, Tokyo, Japan

[21] Appl. No.: 735,550

[22] Filed: Oct. 23, 1996

[30] Foreign Application Priority Data

Oct. 25, 1995 [JP] Japan .................................. 7-277318

[51] Int. Cl.$^6$ .................................................. H01L 29/92
[52] U.S. Cl. ......................... 257/532; 257/499; 257/536
[58] Field of Search ................................... 257/532, 533, 257/535, 903, 904, 499, 500

[56] References Cited

U.S. PATENT DOCUMENTS

| | | | |
|---|---|---|---|
| 4,264,872 | 4/1981 | Suzuki ................................. | 330/253 |
| 4,626,881 | 12/1986 | Kishi et al. ........................... | 257/535 |
| 4,816,894 | 3/1989 | Hattori ................................. | 257/532 |
| 5,424,675 | 6/1995 | Matsushita ........................... | 327/558 |
| 5,479,045 | 12/1995 | Narahara et al. .................... | 257/532 |
| 5,508,881 | 4/1996 | Stevens ................................ | 257/532 |

FOREIGN PATENT DOCUMENTS

| | | | |
|---|---|---|---|
| 63-029962 | 2/1988 | Japan ................................... | 257/535 |
| 2-240958 | 9/1990 | Japan ................................... | 257/532 |
| 2-305460 | 12/1990 | Japan ................................... | 257/532 |
| 3-283651 | 12/1991 | Japan ................................... | 257/532 |
| 4-196583 | 7/1992 | Japan ................................... | 257/532 |
| 5-235266 | 9/1993 | Japan ................................... | 257/532 |

OTHER PUBLICATIONS

Patent Abstracts of Japan, vol. 018, No. 022, Jan. 13, 1994, JP 5–259390, Yamamoto et al.
Patent Abstracts of Japan, vol. 012, No. 285, Aug. 4, 1988, JP 63–060613, Takai.
Patent Abstracts of Japan, vol. 095, No. 006, Jul. 31, 1995, JP 7–058294, Yoshida.
Patent Abstracts of Japan, vol. 013, No. 483, Nov. 2, 1989, 1–191463 Fujiwara et al.
Patent Abstracts of Japan, vol. 010, No. 217, Jul. 29, 1986, 61–054709, Matsumoto.
Iida et al., "Precise Capacitor Structure Suitable for Submicron Mixed Analog/Digital Asics", Proceeding of the Custom Integrated Circuits Conf., Boston, May 13–16, 1990, pp. 1851–1854.
Singh et al., "A Fast and Area–Efficiency BWC Array D/A and A/D Conversion Scheme", IEEE Transactions on Circuits and Systems, vol. 36, NR. 6, pp. 912–916.

*Primary Examiner*—David B. Hardy
*Attorney, Agent, or Firm*—Foley & Lardner

[57] ABSTRACT

Capacitors C1 and C2, as insulation layer separated elements forming an element pair of a differential circuit, have a common independent N well formed independently of an N well connected to a power source VDD. Since the independent N well is in floating condition, even when high level spike noise generated upon switching of CMOS or so forth is superimposed on the power source VDD, the high level spike noise is not directly transmitted to the independent N well, making fluctuation of bias potential of the independent N well small. Therefore, a potential difference in the independent N well due to impedance resistance in the independent N well becomes small.

8 Claims, 5 Drawing Sheets

SEMICONDUCTOR DEVICE HAVING AN INTEGRATED DIFFERENTIAL CIRCUIT WITH AN IMPROVED COMMON-MODE REJECTION RATIO (CMRR)

BACKGROUND OF THE INVENTION

1. Field of the Invention

The present invention relates to a semiconductor integrated circuit with a differential circuit.

2. Description of the Related Art

Conventionally, since a differential circuit can be fabricated with pairs of elements which have the same characteristics, it can provide temperature compensation with respect to a differential input of the differential circuit. Therefore, such semiconductor integrated circuit can operate in wide temperature ranges and thus are frequently used in amplifier circuits and so forth. For example, FIG. 1A is a circuit diagram showing a differential amplifier circuit included in the conventional semiconductor integrated circuit, and FIG. 1B is a waveform diagram showing the operation thereof. With reference to FIGS. 1A and 1B, the differential amplifier circuit is constructed with respective pairs of elements of N-type transistors N1 to N2, P-type transistors P1 to P2, N-type transistors N4 to N5, P-type transistors P4 to P5, capacitors C1 to C2 and N-type transistor N3.

P-type transistors P1 to P2 and P-type transistors P4 to P5 are junction separated elements having PN junction surfaces with N wells 2 connected to a power source VDD. Also, the capacitors C1 and C2 are insulation layer separated elements having PN junction surfaces formed above the same N well 2 via the insulation layer.

The capacitors C1 and C2 receive differential signals IN and their inverted signals $\overline{IN}$ at respective terminals and transmit differential signals to gates of respective N-type transistors N1 and N2 by connecting the other terminals C12 and C22 of the capacitors C1 and C2 to N-type transistors N1 and N2.

The N-type transistors N1 and N2 amplify the differential signals by operating two transistors in mutually different phases corresponding to the differential signals input to the gate terminals. Then, an output OUT of the differential amplifier circuit is output through a drain terminal of the N-type transistor N2.

The P-type transistors P1 and P2 operate as load elements of the element pair constituted with the N-type transistors N1 and N2.

The N-type transistor N3 receives a reference voltage VR at a gate terminal. A drain terminal of the N-type transistor N3 is connected to a common junction of the element pair constituted by the N-type transistors N1 and N2 to supply a constant current.

The N-type transistors N4 and N5 and the P-type transistors P4 and P5 receive a control signal Φ or its inverted signal $\overline{\Phi}$ at gate terminals and are turned ON when the control signal Φ is high level. A bias voltage VB is supplied to the other terminals C12 and C22 of the capacitors C1 and C2. Thus, a bias circuit is constituted by the N-type transistors N4 and N5 and the P-type transistors P4 and P5.

Next, referring to FIG. 1B, the operation of the conventional differential amplifier circuit will be explained. The differential amplifier circuit receive two input signals in time division corresponding to the high level period and low level period of the control signal Φ, respectively as the differential input signals IN or $\overline{IN}$ and output OUT as result of comparison of both input signals before transition of the control signal Φ from low level to high level.

At first, when the control signal Φ is high level, transistors N4 and N5 and P4 and P5 are turned ON to supply a bias voltage VB to the other terminals C12 and C22 of the capacitors C1 and C2. In the capacitors C1 and C2, charge proportional to the differential input signal IN or $\overline{IN}$ is accumulated.

Next, when the control signal Φ becomes low level, the transistors N4 and N5 and P4 and P5 are turned off. Thus, the charge accumulated in the capacitors C1 and C2 attains a holding condition. Then, another input signal is input in time division as the differential input signal IN or $\overline{IN}$. In this example, there is shown a case where the potential of the input signal to be compared is lowered as shown by the waveform of the differential input signal IN of FIG. 1B. Since the charge accumulated in the capacitor C1 is maintained, the potential of the other terminal of the capacitor C1 is lowered from the bias voltage VB as shown by the solid line associated with the differential input signal IN.

On the other hand, since the potential of the differential input signal $\overline{IN}$ is not varied and the potential is stored in the capacitor C2, the potential at the other terminal C22 of the capacitor C2 is maintained at the bias voltage VB as shown by the solid line.

Accordingly, the differential amplifier circuit outputs low level as the output OUT as a result of comparison of two input signals input in time division respectively corresponding to the high level period and the low level period of the control signal Φ, before transition from the low level to the high level of the control signal Φ.

In this case, the capacitor C1 and C2 of the differential amplifier circuits is formed above an N well 2 the same as N well 2 where the P-type transistors P1 to P5 are formed, via an insulation layer. Since the N well 2 is biased by the power source VDD, a parasitic capacitance between other element can be lowered. On the other hand, since the noise applied to the electrodes of the capacitors C1 and C2 has the same phase, the noise is eliminated by the differential circuit to reduce malfunction of the differential amplifier circuit.

However, in the conventional semiconductor integrated circuit having a differential circuit, high level spike noise generated during switching maybe superimposed on a power source line associated with increased package size, such as an installed CMOS logic circuit or so forth. The high level spike noise superimposed on the power source line is superimposed on the potential of the N well connected to the power source line, as shown in FIG. 1B, and is superimposed on a signal potential of the other terminals C12 and C22 of the capacitors C1 and C2 via the parasitic capacitance between the N well and the capacitors C1 and C2. In this case, for impedance resistance in the N well, a phase difference of the noises superimposed on the signal potential of the other terminals C12 and C22 of the capacitors C1 and C2 is caused. Also, there is a limit in a common-mode rejection ratio CMRR of the differential circuit, making it difficult to completely remove the noise and causing malfunction of the differential circuit.

SUMMARY OF THE INVENTION

It is an object of the present invention to provide a semiconductor integrated circuit having a differential circuit which can improve a common-mode rejection ratio (CMRR) of the differential circuit with respect to a high level spike noise superimposed on a power source line.

A semiconductor integrated circuit with a differential circuit, according to one aspect of the invention, comprises:

a junction separating element having a PN junction surface with a semiconductor substrate or a well connected to a power source; and a plurality of insulation layer separated elements separated by an insulation layer having no PN junction surface. The insulation layer separated elements have the independent well formed separately from the well, in common. In contrast to this, each of the insulation layer separated elements may have an independent well formed separately from the well. In this case, respective independent wells are mutually connected by the low resistance wiring.

In the semiconductor integrated circuit according to the present invention, since the insulation layer separated elements forming the element pair of the differential circuit have independent wells formed independently of the well connected to the power source, via the lower insulation layer, or since the insulation layer separated elements have independent wells respectively and the independent wells are mutually connected by the low resistance wiring, even if high level spike noise to be generated upon switching of the CMOS or so forth, associated with increased of package size of mounted CMOS logic circuit or so forth, is superimposed on the power source, the high level spike noise is not directly transmitted to the independent well. Thus, even when it is indirectly influenced by the noise, fluctuation of the bias potential of the independent well becomes small and moderate.

Therefore, a potential difference in the independent well of the impedance resistance in the independent well becomes small enough to make the fluctuation superimposed on the signal potential of the element pair constituted of the capacitors small and to have equal phase components. Therefore, a common mode rejection ratio CMRR of the differential circuit can be improved.

On the other hand, a period made unstable by the noise can be shortened, to permit faster output of the differential circuit than that in the conventional differential circuit.

Furthermore, noise resistance of the semiconductor integrated circuit having the differential circuit can be improved to make the package size of the CMOS logic circuit or so forth to be mounted greater.

BRIEF DESCRIPTION OF THE DRAWINGS

The present invention will be understood more fully from the detailed description given herebelow and from the accompanying drawings of the preferred embodiment of the invention, which, however, should not taken to be limit the present invention, but are for explanation and understanding only.

In the drawings.

DESCRIPTION OF THE PREFERRED EMBODIMENT

Next, the present invention will be discussed with reference to the accompanying drawings. In the following description, numerous specific details are set forth in order to provide a thorough understanding of the present invention. It will be obvious, however, to those skilled in the art that the present invention may be practiced without these specific details. Some well-known structures are not shown in detail in order not to obscure the present invention.

Figure 1A:
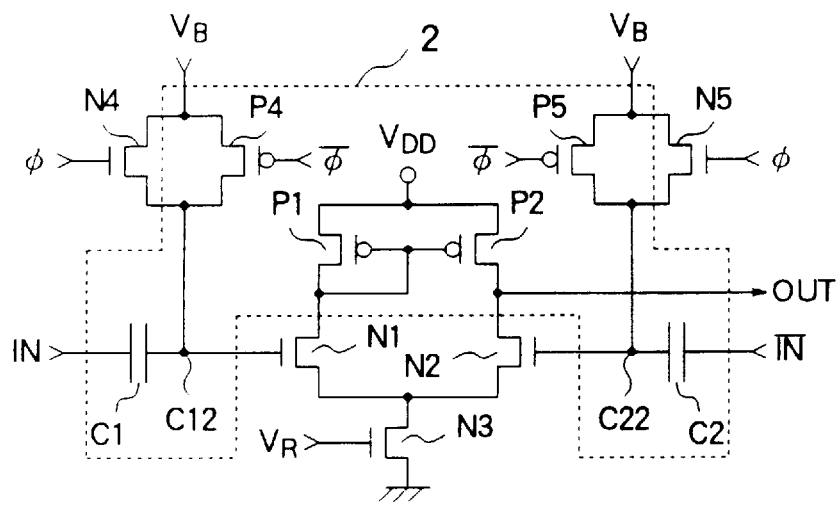
FIG. 1 is a circuit diagram showing the conventional semiconductor integrated circuit, and FIG. 1B a waveform chart showing operation thereof.
Figure 1B:
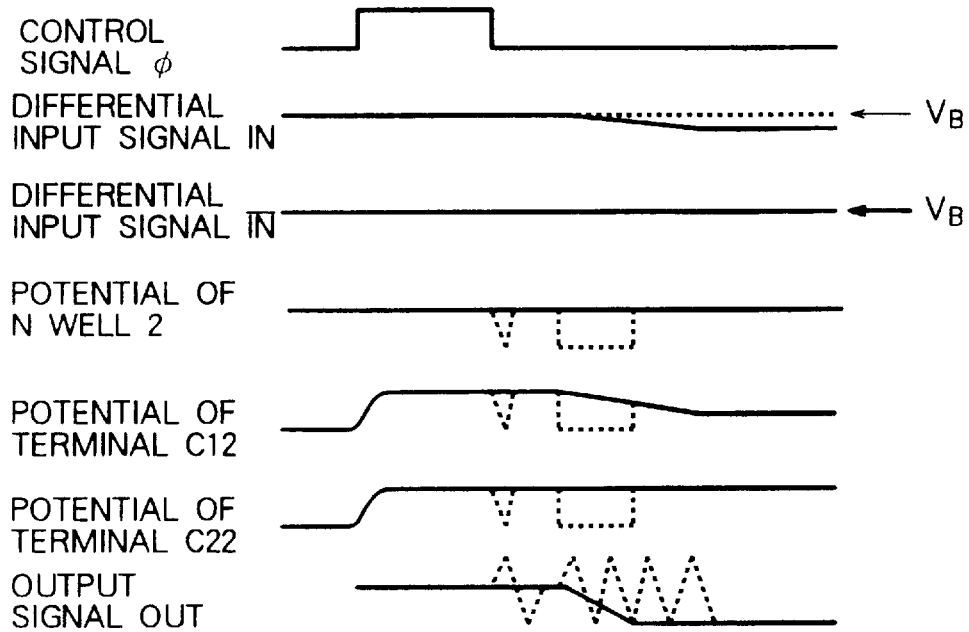
Figure 2A:
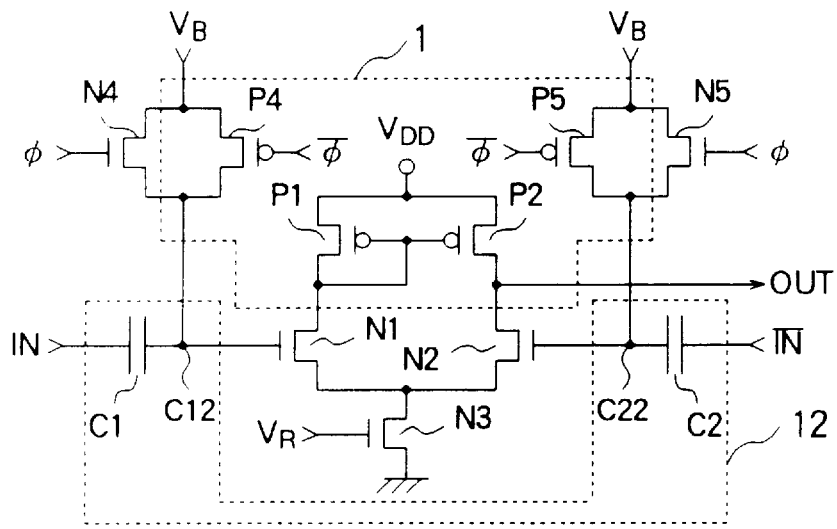
FIG. 2A is a circuit diagram showing the first embodiment, of a semiconductor integrated circuit.
Figure 2B:
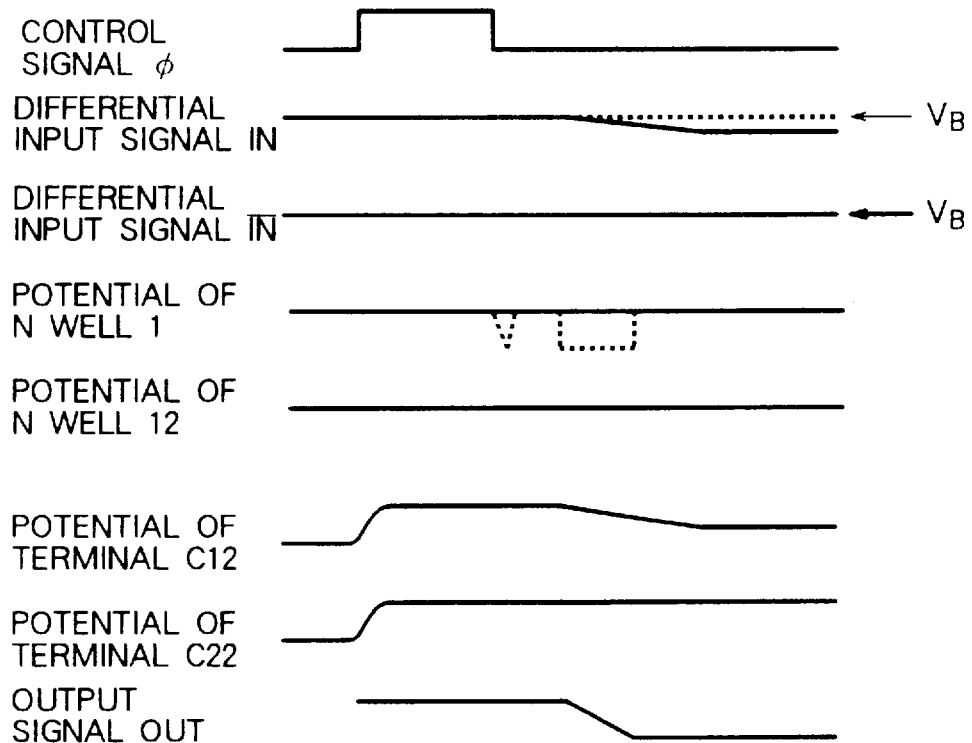
FIG. 2B is a waveform chart showing operation thereof.

FIGS. 2A is a circuit diagram showing the first embodiment of a semiconductor integrated circuit according to the present invention, and showing a differential circuit portion of the illustrate embodiment. FIG. 2B is a waveform chart showing signal waveforms at various positions of the first embodiment of the differential circuit in the first embodiment of the semiconductor integrated circuit. With reference to FIGS. 2A and 2B, the illustrate embodiment of the differential circuit is constructed with respective pairs of elements of N-type transistors N1 and N2, P-type transistors P1 and P2, N-type transistors N4 and N5, P-type transistors P4 and P5, capacitors C1 and C2, and N-type transistor N3, similarly to the conventional differential circuit of the semiconductor integrated circuit of FIGS. 1A and 1B.

A difference between the differential circuit of the present embodiment shown in FIG. 2A and the conventional circuit of FIG. 1A is that an independent N well 12 is formed so as to be independent of an N well 1 which is connected to a power source VDD as shown in FIG. 2A, and the capacitors C1 and C2 which serves as an insulation layer separate elements forming the element pair of the differential circuit having the independent N well 12 in common via a lower insulation layer.

Therefore, the operation of a circuit including a parasitic capacitance between the capacitors C1 and C2 and the N well 1 is different. It should be noted that portion of the shown embodiment of the differential circuit where the structure and operation overlap with the conventional circuit of FIG. 1A are omitted from discussion given hereinafter to keeping the disclosure simple enough to facilitate clear understanding of the present invention.

Figure 3A:
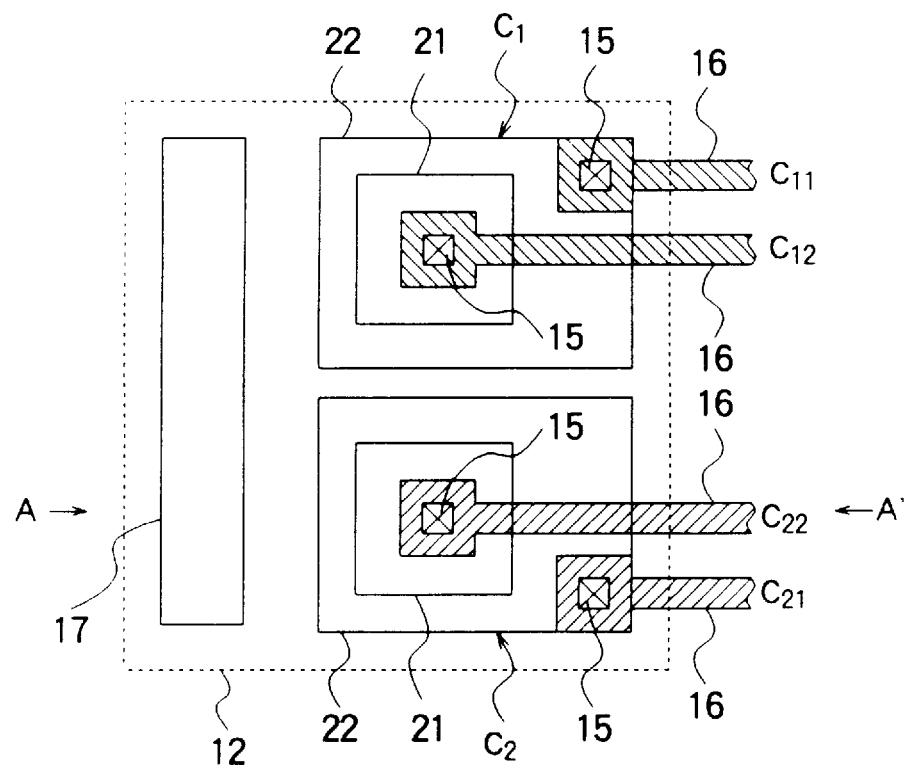
FIG. 3A is a plan view showing detailed structure of capacitors C1 and C2 of FIG. 2A, and FIG. 3B section thereof.
Figure 3B:
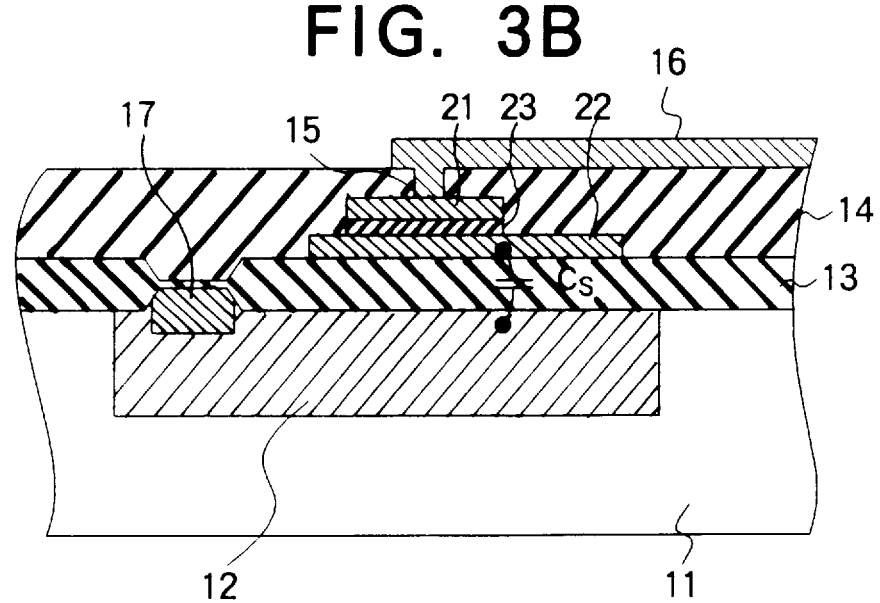

FIGS. 3A and 3B are a plan view and a section respectively showing detailed construction of the element pair constituted by capacitors C1 to C2 in the circuit of FIG. 2A. With reference to FIGS. 3A and 3B, the independent N well 12 is formed on the P type semiconductor substrate 11. The element pair constituted by capacitors C1 and C2 is formed above the independent N well 12 via an insulation layer 13. The independent N well 12 is lowered in its impedence by expending an $N^+$ diffusion layer 17 toward the inside and is not supplied the power to be held in floating condition.

Explaining the sectional structure by taking the capacitor C2 as example, the capacitor C2 is constructed with an upper electrode 21 and a lower electrode 22, each of them being formed of a polycrystalline silicon, an insulation layer 23 formed between the upper electrode 21 and the lower electrode 22, and a metal wiring 16 connecting the upper electrode 21 and the lower electrode 22 to the terminals C21 and C22 via contact holes 15 opened through an insulation layer 14. The structure of the capacitor C1 is the same as that set forth above.

Next, operation of the illustrated embodiment of the semiconductor integrated circuit will be discussed with reference to FIGS. 2A, 2B, 3A and 3B. The independent N well 12 in the illustrated embodiment is in floating condition. Therefore, as shown in FIG. 2B, when the high level spike-like noise generated upon switching of CMOS or so forth is superposed on the power source VDD, the high level spike-like noise is not directly transmitted to the independent N well 12 permitting it to maintain constant potential. Therefore, even when a parasitic capacity CS is present between the lower electrode 22 forming the capacitors C1 and C2 and the independent N well 12, the noise is never transmitted to the other terminals C12 and C22, and thus malfunction of the differential circuit will never be caused.

It should be noted that since the independent N well 12 is in the floating condition in the shown embodiment, the bias potential of the independent N well 12 becomes unstable. However, since the capacitors C1 and C2 are formed on the independent N well 12 via the insulation layer 13, the bias potential of the independent N well 12 will never influence the terminal signals of the capacitors C1 and C2. Also, since the independent N well 12 is in the floating condition, even if the bias potential of the independent N well 12 is indirectly influenced by circumferential noise, different from direct influence, fluctuation of the bias potential of the independent N well 12 becomes small and moderate. Therefore, a potential difference in the independent N well 12 by the impedance resistance in the independent N well 12 becomes small enough to make the fluctuation superimposed on the signal potential of the other terminals C12 and C22 of the capacitors C1 and C2 small and to have only in-phase components. Thus, the differential circuit having common-mode rejection ratio performance will never cause malfunction. Furthermore, in the shown embodiment, by internally extending the N$^+$diffusion layer 17, the impedance resistance in the N well can be lowered. Therefore, the common-mode rejection ratio performance of the differential circuit can be further improved.

Figure 4A:
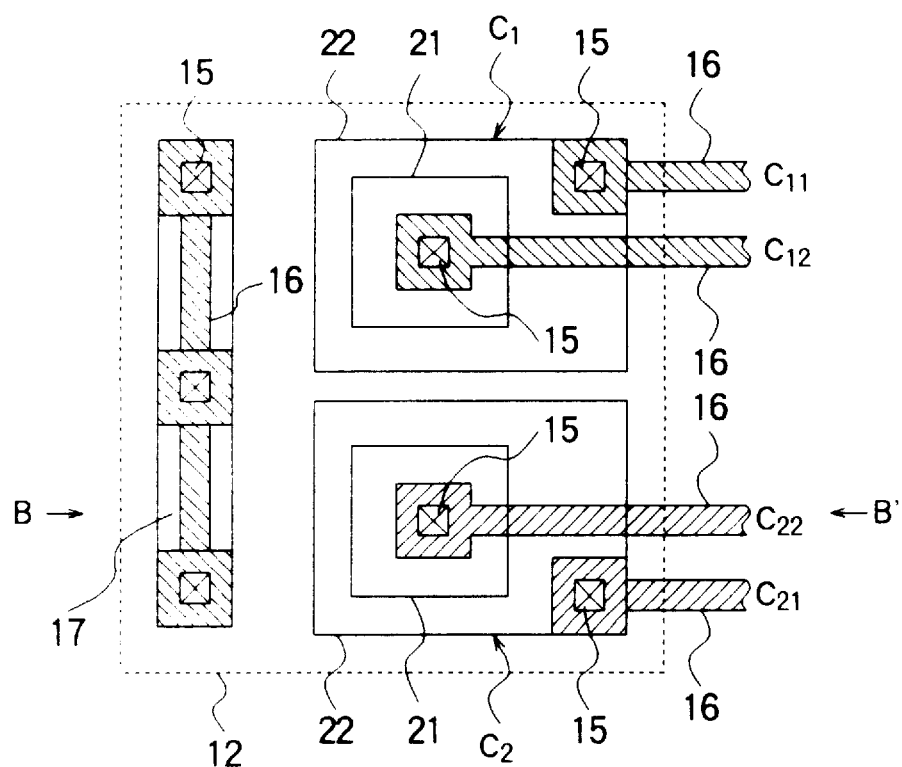
FIG. 4A is a plan view showing detailed structure of capacitors C1 and C2 in the second embodiment of the semiconductor integrated circuit according to the present invention.
Figure 4B:
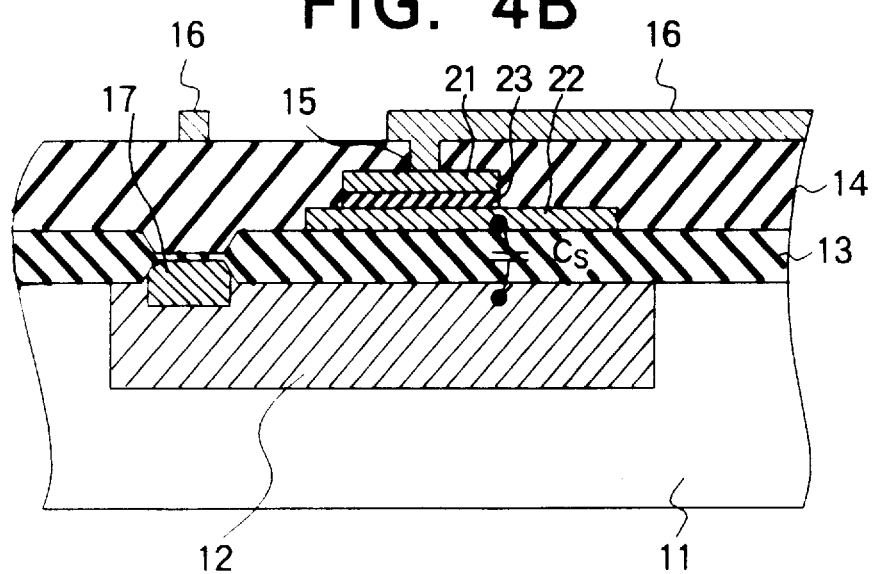
FIG. 4B is a section thereof.

FIGS. 4A and 4B are a plan view and section respectively showing the element pair constituted of the capacitors C1 and C2 in the second embodiment of the semiconductor integrated circuit according to the present invention. The difference of the illustrated embodiment to the first embodiment shown in FIGS. 3A and 3B is in that the N$^+$diffusion layer 17 in the independent N well 12 is backed with a metal wiring 16 with low resistance at a plurality of positions via the contact holes 15 opened through insulation layer 14. Other construction is similar to the first embodiment of the invention. Therefore, the elements common to the first embodiment will be represented by the same reference numerals and detailed description thereof will be omitted from discussion.

By backing with the metal wiring 16, the impedance resistance in the N$^+$diffusion layer 17 and the independent N well 12 is lowered to further reduce phase difference due to fluctuation superimposed on the signal potential of the other terminals C12 and C22. Therefore, the illustrated embodiment is effective in improving the common-mode rejection ratio performance of the differential circuit.

Figure 5A:
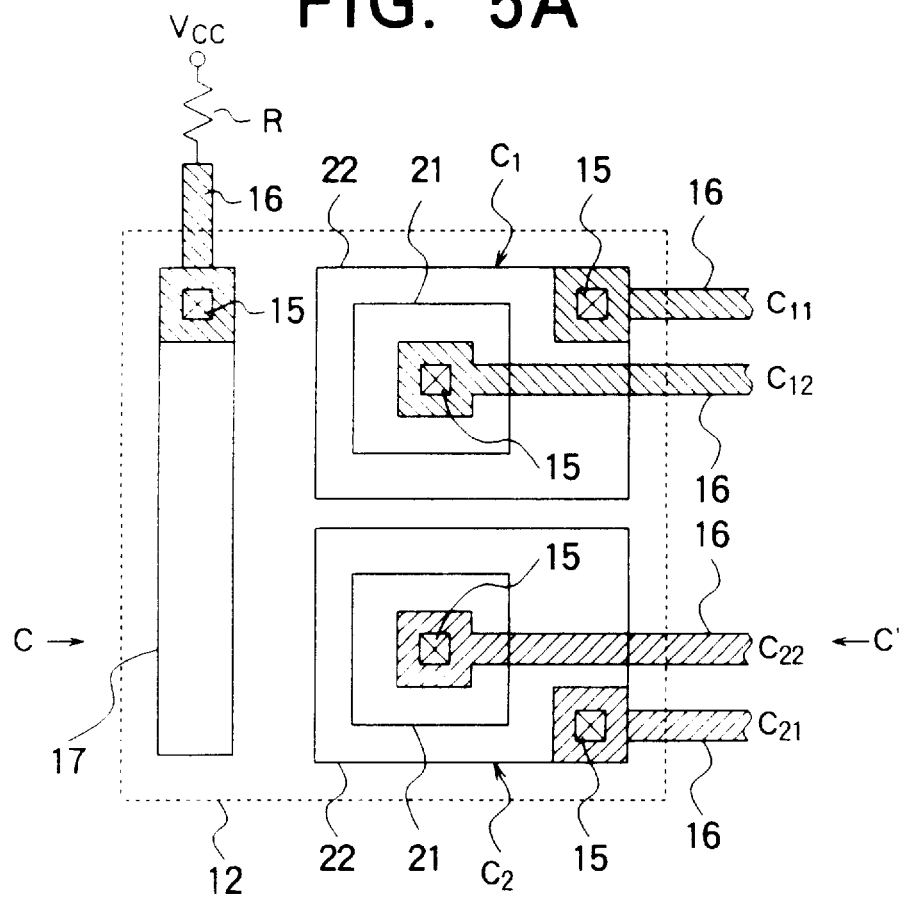
FIG. 5A is a plan view showing detailed structure of capacitors C1 and C2 in the third embodiment of the semiconductor integrated circuit according to the present invention.
Figure 5B:
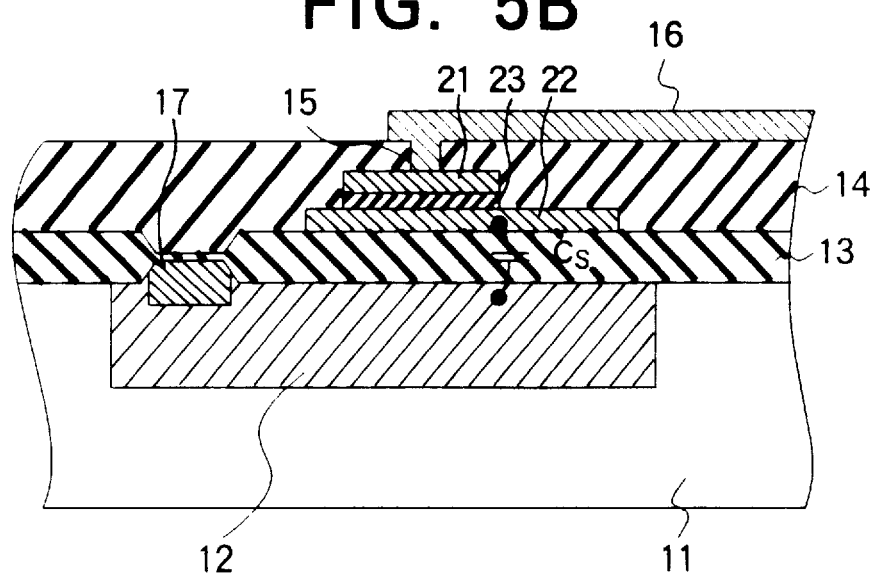
FIG. 5B is a section thereof.

FIGS. 5A and 5B are a plan view and section showing the detailed constriction of the element pair constituted of capacitors C1 and C2 in the third embodiment of the semiconductor integrated circuit according to the present invention. The difference of the illustrated embodiment to the first embodiment shown in FIG. 2 is in that the N$^+$diffusion layer 17 of the independent N well 12 is connected to the metal wiring 16 via the contact holes 15 opened through the insulation layer 14. Also, the metal wiring 16 is connected to the power source VDD via a resistor element R to bias the independent N well 12 at the voltage of the power source VDD. Other construction is similar to the first embodiment of the invention. Therefore, the elements common to the first embodiment will be represented by the same reference numerals and detailed description thereof will be omitted from discussion.

The illustrated embodiment of the independent N well 12 is biased to the voltage of the power source VDD via the resistor element R. Therefore, even when high level spike noise is superimposed on the power source VDD upon switching of the CMOS, the noise is attenuated by the resistor element R and is not transmitted to the independent N well 12, which maintains constant potential. As set forth, the noise is not transmitted to the terminals C11 and C22 of the capacitors C1 and C2 and thus malfunction will never be caused. Furthermore, since the independent N well 12 is biased at the voltage of the power source VDD, it is advantageous in that the element, such as a P-type transistor, which may suffer the influence of the bias of the independent N well 12 on the performance thereof, can be formed within the independent N well 12. Of course, it is obvious that a similar effect is obtainable even when the independent N well 12 is biased at a potential of (½) VDD, GND or so forth via the resistor element R.

By combining the detailed structures of the element pairs constituted by the capacitors C1 and C2 in the first to third embodiments of the semiconductor integrated circuit according to the present invention, the potential difference to be caused in the independent N well 12 becomes smaller to achieve synergistic effect, such as enhancement of the anti-noise effect.

On the other hand, in the first to third embodiments of the semiconductor integrated circuit according to the present invention, examples where the capacitor elements are taken as an element pair have been discussed. Similar effects can be obtained with respect to other examples where other circuit elements, such as the resistor elements, are taken as element pairs.

Furthermore, in the first to third embodiments of the semiconductor integrated circuit according to the present invention, discussion has been given for the case where the capacitor elements forming the element pair have the independent N well 12 formed independently of the N well 1 in common via the lower insulation layer. However, it is possible that each of the capacitor elements forming the element pair has an independent well via lower insulation layer, and the independent wells are mutually connected by the metal wiring to achieve a similar effect.

Although the invention has been illustrated and described with respect to exemplary embodiments thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. A semiconductor device comprising:
   a substrate having a first well of a predetermined conductivity type and a second well of said predetermined conductivity type formed independently from said first well;
   a first input terminal;
   a second input terminal:
   an output terminal;
   a differential amplifier circuit connected to said output terminal and having a first input node and a second input node, and said differential amplifier circuit having an element formed in said first well;

a first capacitor connected between said first input terminal and said second input node and formed in said second well; and a second capacitor connected between said second input terminal and said second input node and formed in said second well.

2. The device as claimed in claim 1, wherein said second well has lower impedance than said first well.

3. The device as claimed in claim 1, wherein said element includes a load element formed in said first well.

4. The device as claimed in claim 1, further comprising a bias circuit connected to said first and second nodes for biasing said first and second nodes at a predetermined bias voltage, respectively.

5. The device as claimed in claim 4, wherein said bias circuit has a transfer gate formed in said first well.

6. The device as claimed in claim 1, further comprising a low resistance region of said predetermined conductivity type connected to said second well.

7. The device as claimed in claim 1, further comprising a low resistance wiring connected to said second well at a plurality of portions.

8. The device as claimed in claim 1, further comprising a resistor element connected between said second well and said power source.

* * * * *